United States Patent
Shih et al.

[11] Patent Number: 5,945,774
[45] Date of Patent: Aug. 31, 1999

[54] OPEN PACKAGE FOR CRYSTAL OSCILLATOR CHIPS

[75] Inventors: Ming-Chang Shih, Taipei; Kuo-Chuan Chen, Hsinchu, both of Taiwan

[73] Assignee: Industrial Technology Research Institute, Hsin-Chu, Taiwan

[21] Appl. No.: 08/827,238

[22] Filed: Mar. 28, 1997

[51] Int. Cl.⁶ .................................................. H01L 41/08
[52] U.S. Cl. .......................... 310/348; 310/349; 310/365
[58] Field of Search ................................... 310/312, 361, 310/369, 346, 348, 316, 340, 344, 349, 365, 366

[56] References Cited

U.S. PATENT DOCUMENTS

| | | | |
|---|---|---|---|
| 3,916,490 | 11/1975 | Sheahan et al. | 29/25.35 |
| 4,012,700 | 3/1977 | Besson | 331/116 R |
| 4,218,631 | 8/1980 | Yamaguchi | 310/312 |
| 4,375,041 | 2/1983 | Aizawa et al. | 310/348 |
| 4,746,905 | 5/1988 | Harima et al. | 310/348 |
| 4,757,581 | 7/1988 | Yamada et al. | 310/348 |
| 5,030,875 | 7/1991 | Knecht | 310/346 |
| 5,055,838 | 10/1991 | Wise et al. | 340/870.37 |
| 5,234,566 | 8/1993 | Osman et al. | 204/403 |
| 5,235,135 | 8/1993 | Knecht et al. | 174/52.3 |
| 5,382,929 | 1/1995 | Inao et al. | 310/344 |
| 5,445,920 | 8/1995 | Saito | 430/311 |
| 5,447,845 | 9/1995 | Chu et al. | 310/340 |
| 5,468,408 | 11/1995 | Sugama et al. | 252/62.2 |
| 5,502,344 | 3/1996 | Yoshimoto et al. | 310/344 |
| 5,585,687 | 12/1996 | Wakabayashi et al. | 310/366 |
| 5,635,672 | 6/1997 | Kawaura | 310/344 |
| 5,696,422 | 12/1997 | Hanson et al. | 310/344 |
| 5,705,399 | 1/1998 | Larue | 436/501 |
| 5,801,474 | 9/1998 | Sakairi | 310/344 |
| 5,821,665 | 10/1998 | Onishi et al. | 310/344 |
| 5,838,093 | 11/1998 | Sakai et al. | 310/348 |

OTHER PUBLICATIONS

M.R. Deakin et al, "Electrochemical applications of Quartz crystal Microbalance", Analytical Chemistry, vol. 61 1989, pp. 1147–1154.

G.G. Guilbault, "Determination of Formaldehyde with an Enzyme–Coated Piezoelectric Crystal Detector", Analytical Chemistry, vol. 55, 1983, pp. 1682–1684.

*Primary Examiner*—Thomas M. Dougherty
*Attorney, Agent, or Firm*—George O. Saile; Stephen B. Ackerman

[57] ABSTRACT

An improved crystal oscillator package is described in which the crystal oscillators are attached to ceramic substrates by means of connectors, formed from materials such as silver-platinum and silver, using thick film techniques. An optional opening in the substrate allows a liquid or gaseous medium to make easy contact with the oscillator chips' electrodes on which a biosensitive film of a specific receptor has been deposited, thereby allowing the crystals to act as detectors. In the case of the multi-oscillator module, several different detectors may be present in the same unit.

6 Claims, 5 Drawing Sheets

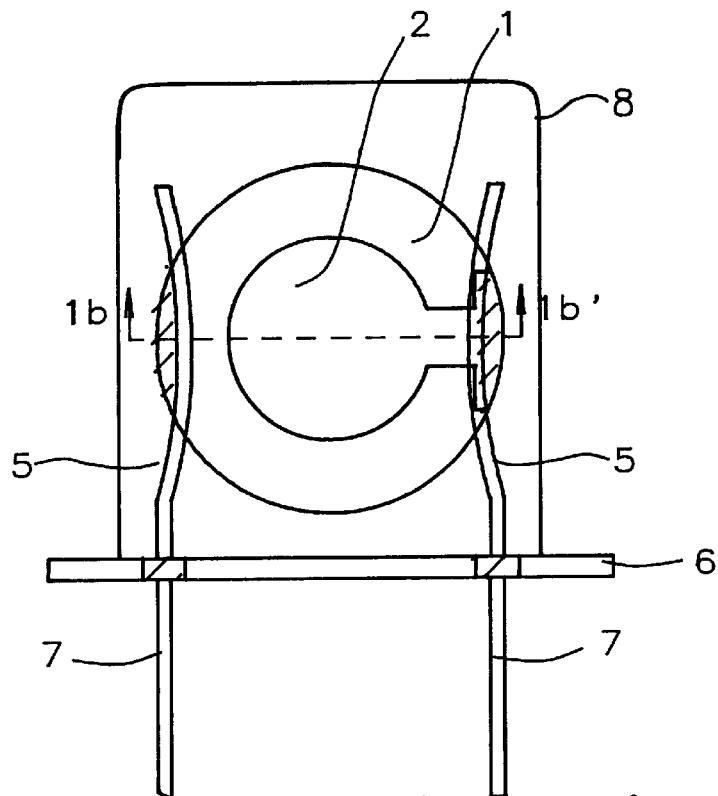
FIG. 1a - Prior Art
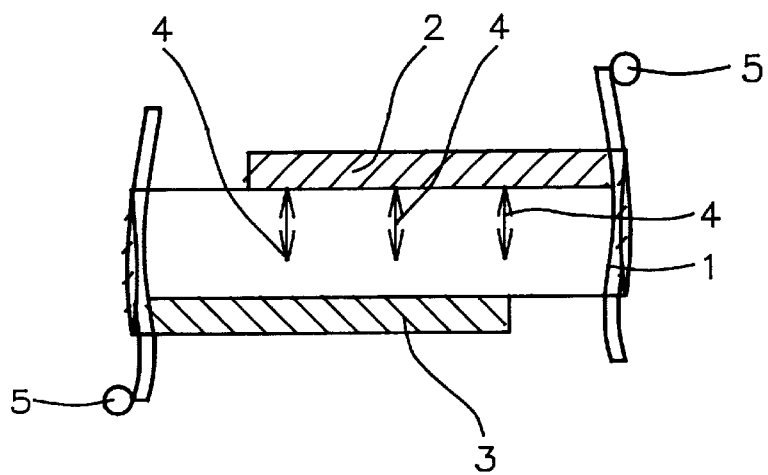
FIG. 1b - Prior Art

OPEN PACKAGE FOR CRYSTAL OSCILLATOR CHIPS

BACKGROUND OF THE INVENTION

(1) Field of the Invention

The invention relates to the general field of packaging, more particularly to the packaging of crystal oscillator chips.

(2) Description of the Prior Art

Crystal oscillators derive their function from the piezoelectric effect. Most commonly they are cut from a single crystal of quartz and deform slightly in the presence of an electric field. As illustrated in FIGS. 1a and 1b, quartz crystal 1 is sandwich-coated between two metal electrodes 2 and 3 (normally gold) bonded to a lead frame which is part of a metal can package. The electrodes are used to induce an oscillating electric field in the crystal.

The oscillating electric field produces mechanical strain in the form of a standing wave whose direction depends on the lie of the crystal lattice relative to the surface. In an AT cut quartz wafer, shear oscillations predominate and the mechanical displacements are parallel to the wafer surface. Thus, if the applied electric frequency is equal or close to the natural (mechanical) vibrational frequency of the oscillating wafer (or chip), resonance will occur. An electric oscillator circuit can be designed to lock onto the resonant frequency, making for a highly stable oscillator.

The natural vibrational frequency of a crystal chip depends on a number of factors including thickness, density, and shear modulus, as well as the mass of material that is present on either or both surfaces. The last of these factors is the easiest to change since the mass of the electrodes 2 and 4 can be modified through etching or through additional material deposition. In the production of standard crystals for the communications industry, chips are generally fine tuned by electroplating additional amounts of metal onto the electrodes. The same principle may be used to measure the adsorption of small amounts of material onto a surface. Such a device is known as a Quartz Crystal Microbalance (QCM) and has a mass sensitivity of about 1 kHz per microgram with a theoretical limit as low as $10^{-6}$ micrograms.

Returning to FIG. 1a, a typical package of the current art for a QCM is seen. Quartz chip 1 is held between two metal lead frames 15 each of which makes contact to one of the electrodes 2 or 3 through conductive paste 9. The frames are connected to rods 5 that pass through insulated base 6, becoming pins 7 which are suitable for inserting into an appropriate electrical outlet. Protective metal cap 8 may optionally be placed over the device. This form of mounting is chosen with a view to allowing the crystal maximum freedom of movement in the transverse (shear) mode.

The general principles of the QCM, along with several examples of its application, are discussed in an article by M. R. Deakin and D. A. Buttry "Electrochemical applications of the Quartz Crystal Microbalance" in Analytical Chemistry vol. 61 1989 pp. 1147–1154. The use of an enzyme coating on the surface of a QCM as a specific detector for formaldehyde is discussed in an article by G. G. Guilbault "Determination of Formaldehyde with an enzyme-coated piezoelectric crystal detector" in Analytical Chemistry vol. 55 1983 pp. 1682–1684.

SUMMARY OF THE INVENTION

It has been an object of the present invention to provide an open package for a crystal oscillator, more particularly one suited for biochemical sensors.

Another object of the present invention has been to provide a package, for a crystal oscillator, that is surface mountable.

Yet another object of the present invention has been to provide a multi-oscillator module.

A still further object has been that both the single and multi-oscillator packages be compatible with the inclusion of biosensitive films so that they could be used as biochemical detectors.

These objects have been achieved by attaching the crystal oscillators to ceramic substrates by means of connectors, formed from conductive paste materials such as silver-palladium (or copper or gold), using thick film techniques. An optional opening in the substrate allows a liquid or gaseous medium to make contact with the oscillator chips' electrodes on which a biosensitive film of a specific receptor has been deposited, thereby allowing the crystals to act as detectors. In the case of the multi-oscillator module, several different chemical species detectors may be present in the same unit.

BRIEF DESCRIPTION OF THE DRAWINGS

FIG. 1a is a plan view of a crystal oscillator hermetic package of the prior art.

FIG. 1b is a partial cross-section of FIG. 1a.

FIG. 3 is the plan view of which FIG. 2 is a cross-section.

DESCRIPTION OF THE PREFERRED EMBODIMENTS

Figure 2:
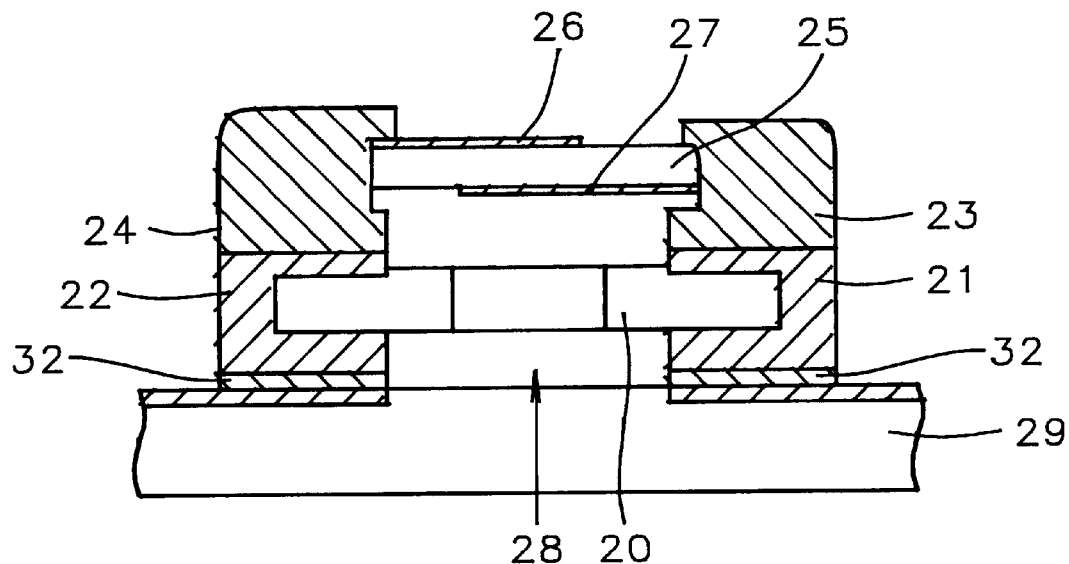
FIG. 2 is a cross-sectional view of a crystal oscillator surface mount (SMD) package according to the present invention.
Figure 3:
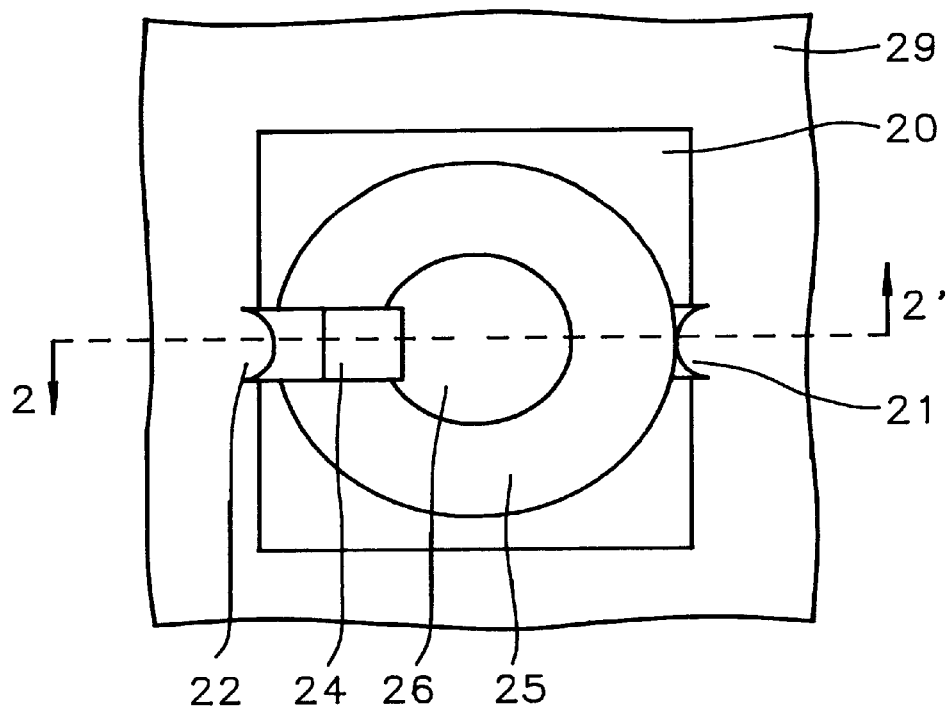

We refer now to FIG. 2 which is cross-section of the package that constitutes the present invention. FIG. 3 is a plan view of the same package. A key component of the package is ceramic substrate 20. Normally rectangular in shape and measuring between about 1 and 1.5 cm. by between about 1 and 1.5 cm., it is provided with two electrode terminals 21 and 22 which are located on opposite edges of the substrate. These terminals are shaped so as to wrap around the edge and extend a short distance along the upper and lower surfaces of the substrate. The material used for the terminals is silver-pallidium, or copper or gold. They are Tanaka-Matthey TR-4903, formed by traditional thick film processes in which a silver-palladium paste is print coated onto a ceramic substrate. After drying at 100° C. for 10 minutes, they are fired at 850° C. for another 10 minutes. As a result, good conductive electrode pads are formed. The typical thickness of the layer of conductive material that is used to form the terminals is between about 8 and 15 microns.

The next feature of the package are electric contact pads (patterned using printing techniques) for connecting terminals 22 and 21 to upper and lower electrodes 26 and 27 respectively of quartz oscillator chip 25. These are marked as 23, for connecting to 27, and 24, for connecting to 26. In addition to making the required electrical connections, contact pads 23 and 24 also serve to ensure that oscillator chip 25 gets securely mounted a short distance above substrate 20 and parallel to its surface. Typically, the spacing between chip 25 and substrate 20 is between about 0.05 and 0.1 mm. defined by the thickness of lower terminal connector 23. To form the connectors we have typically used ABLEBOND 84-1 LM1, an electrically conductive epoxy adhesive paste, but similar materials such as conductive polyimide or silicone adhesives (depending on processing requirements) could also have been used.

Although the package as described above will function perfectly well as a holder of a quartz oscillator chip, in QCM applications where it is desirable to give the materials that are being weighed easy access to the lower as well as the upper electrode, the package may be modified to include an opening in the ceramic substrate. In FIG. 2 this is shown as opening 28 in substrate 20.

Crystal oscillators, packaged as shown in FIGS. 2 and 3, will, in general, need to be attached to a printed circuit board so that they can commununicate with other devices and circuits. Continuing our reference to FIG. 2, printed circuit board 29 and copper signal circuit 30 are shown. It is attached to terminals 21 and 22 through a layer of soldering material 32 consisting of lead-tin made by a dipping process.

Figure 4:
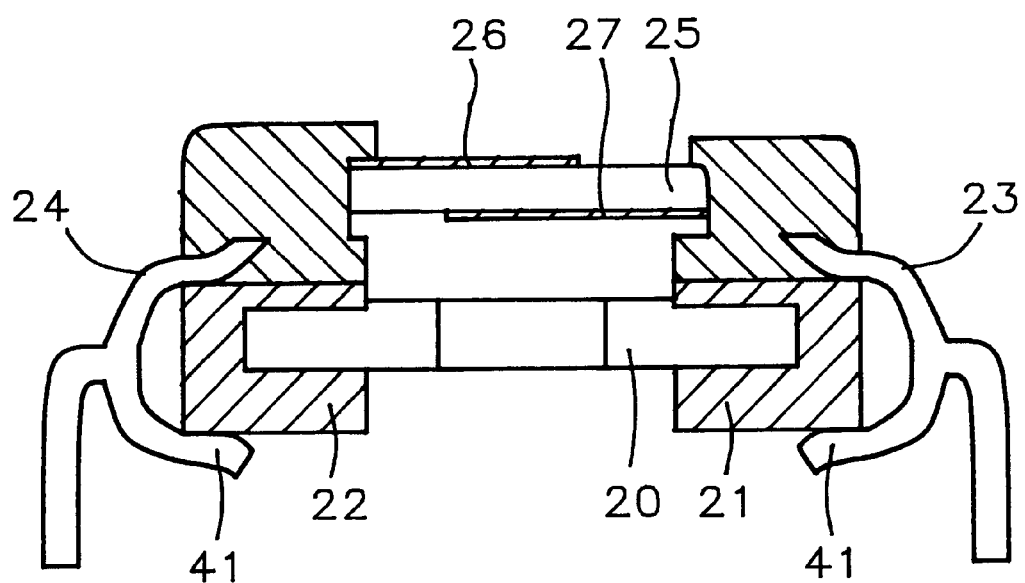
FIG. 4 shows a second embodiment of the package illustrated in FIG. 2.

In a second embodiment of the invention, the method of attachment to the printed circuit board is somewhat different. This is illustrated in FIG. 4. Instead of using a layer of conductive material to connect to the board, in the form of surface mounting, the package is provided with metallic connector pins 41, which are attached, one to each terminal 21 and 22, extending away from the substrate in a direction orthogonal to it. Pins 41 may then be used for insertion into plated-through holes (not shown) provided in the printed circuit board for that purpose.

It should also be mentioned that the packages shown in FIGS. 2, 3, and 4 are suitable for use as QCMs and, more particularly, as detectors for specific substances in both the liquid and the gaseous phases. For this to be achieved, it is necessary to coat either or both surfaces of the thin film electrodes with a biosensitive film (not shown). The surfaces of biosensitive films comprise inorganic materials such as metals or organic materials such as polymers or enzymes. The latter have molecules of the right size and shape that act as very specific receptors for particular substances. When a molecule of the latter approaches such a receptor it is permanently captured and held in place. This accumulation of captured material is, in turn, detected as an increase in mass by the QCM. An example of a biosensitive material is formaldehyde dehydrogenase enzyme which was used as a formaldehyde detector in the article by Guilbault that was mentioned earlier. Other examples of materials that may be detected in very small concentrations by this technique include carbon dioxide, carbon monoxide, oxygen, fluorine, and chlorine.

There are situations where it is desirable to provide a package, or module, which houses more than one crystal oscillator or sensor. This may be for reasons of redundancy in case a given oscillator fails, to provide increased sensitivity and accuracy by combining data from several oscillators, or to use different oscillators for different purposes, more particularly to coat different oscillator electrodes with different biosensitive materials so that more than one substance may be simultaneously detected. Finally, such a module could be used to keep oscillators in close proximity to other components of the total system, for example electrical circuitry.

Figure 5:
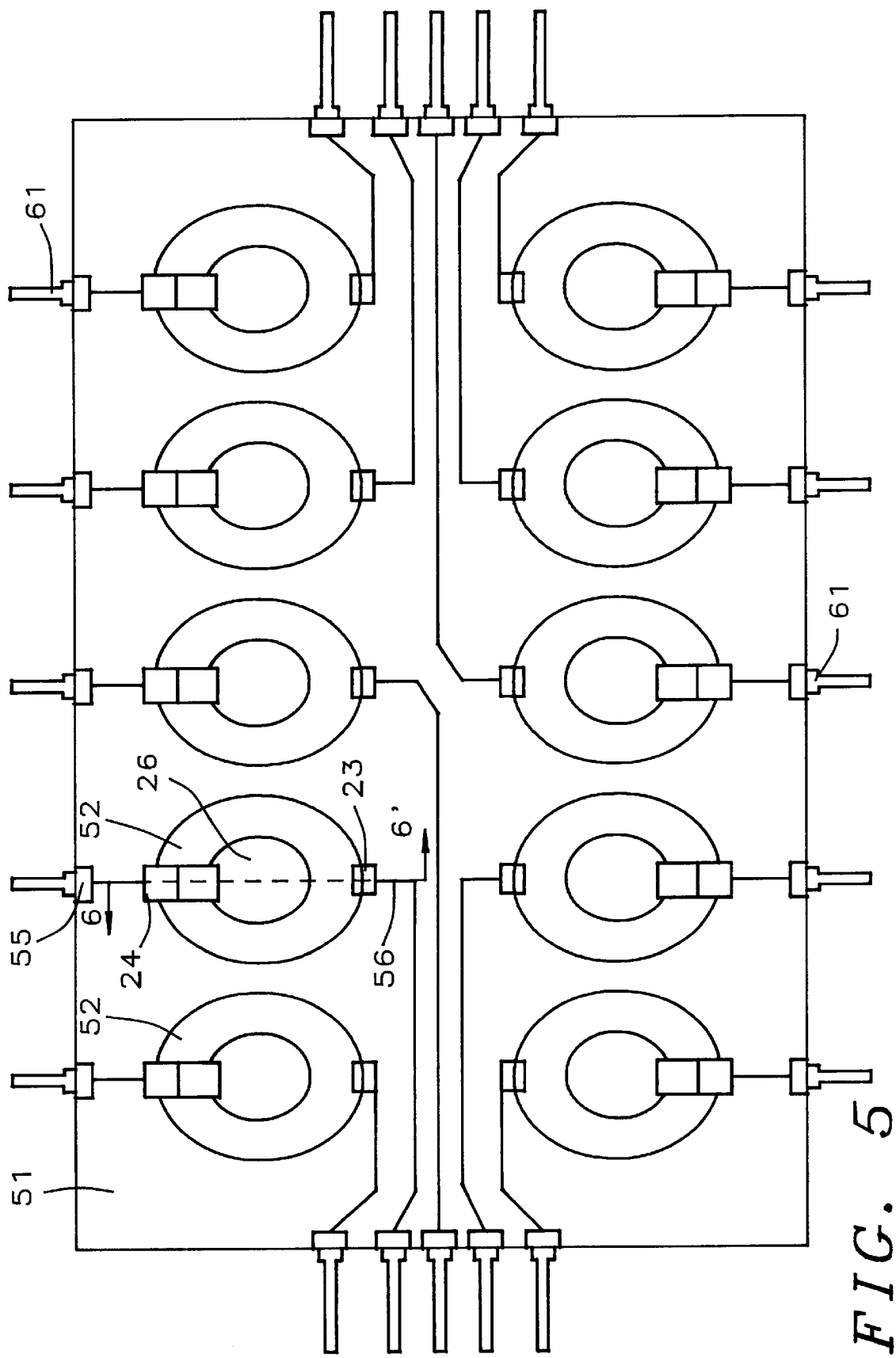
FIG. 5 is a plan view of a multi-oscillator, sensors circuit module in accordance with the present invention.
Figure 6:
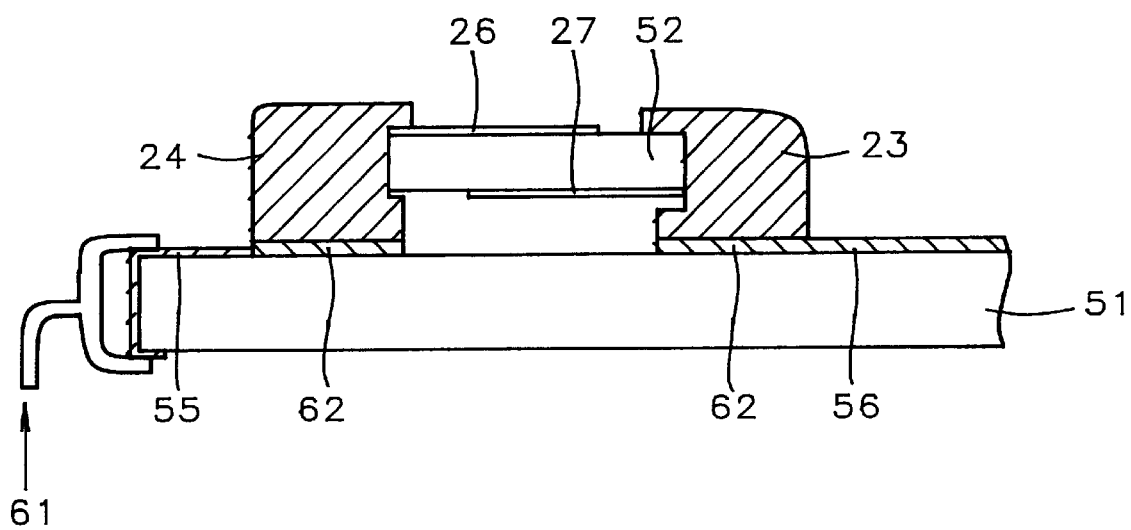
FIG. 6 is a partial cross-section of FIG. 5.

In FIG. 5 we show, in plan view, an example of a multi-oscillator module. A partial cross-section taken through plane 6–6' is shown in FIG. 6. Ceramic substrate 51, measuring between about 2.5 and 5 by between about 2.5 and 5 cm., is seen. A number of crystal oscillator chips such as 52 have been mounted on its surface. While the number of oscillator chips shown in this example is ten, a module of this sort could be used to accommodate anywhere from two to about 20 oscillator chips. As in the single oscillator package described above, each chip has upper and lower thin film electrodes 26 and 27 (made of gold or similar material) to which contact is made through connectors 24 and 23 respectively. The latter are formed from electrically conductive epoxy material such as ABLEBOND 84-1 LM1 or conductive polyimide or silicone adhesive as a layer by means of printing techniques. Thickness of 23 is between about 0.05 and 0.1 mm.

Connectors 23 and 24 are, in turn, attached to thick film silver-palladium electric terminals 62 that lie on the surface of ceramic substrate 51. These terminals connect to printed circuit wiring 55 and 56 (which may be of the same material as 23 and 24), in or on 51, that runs to lead frame connector pins such as 61. In FIG. 5 the pins are shown as projecting outwards from the edge of 51. However, such pins could run orthogonal to the surface of 51 and become another IC packaging type. As in the single oscillator package, the thin film electrodes 26 and 27 may be coated with a biosensitive film (not shown) thereby allowing them to function as biochemical sensors.

It should be noted that, most commonly, the quartz crystals used in the above embodiments have been AT cut. While this is a preferred crystalline orientation for use in these applications, the invention is not limited to it and other cuts may be substituted, where appropriate, with equal effectiveness.

While the invention has been particularly shown and described with reference to the preferred embodiments thereof, it will be understood by those skilled in the art that various changes in form and details may be made without departing from the spirit and scope of the invention.

What is claimed is:

1. A package comprising:

a crystal oscillator chip having upper and lower surfaces;

a ceramic substrate having two opposite edges and top and bottom surfaces rectangular in shape and measuring between about 1 and 1.5 cm. by between about 1 and 1.5 cm.;

two terminals, each comprising a layer of a thick film conductor material, and each coating one of the substrate edges and extending to both the top and bottom surfaces;

two thin film electrodes, one on each of said upper and lower crystal oscillator surfaces;

an opening in the substrate, said opening underlying the thin film electrodes; and conductive connectors that connect each thin film electrode to a single terminal whereby said oscillator chip is mounted at a fixed distance, between about 0.05 and 0.1 mm., from and parallel to said substrate top surface.

2. The package described in claim 1 wherein said thick film conductor material is taken from the group consisting of silver-palladium, copper, and gold.

3. The package described in claim 1 wherein said conductive connector is conductive polyimide adhesive.

4. The package described in claim 1 wherein said crystal oscillator chip is an AT cut quartz crystal.

5. The package described in claim 1 further comprising a printed circuit board attached to the terminals by means of a thick film material taken from the group consisting of silver-palladium, copper, and gold.

6. The package described in claim 1 further comprising a metallic pin, attached to each terminal and extending away from said bottom surface in a direction orthogonal to it.

* * * * *